(12) United States Patent
Kang

(10) Patent No.: US 6,417,670 B1
(45) Date of Patent: Jul. 9, 2002

(54) ACCURATE BATTERY CURRENT MEASUREMENT SYSTEM FOR A BATTERY CARE UNIT

(75) Inventor: Dennis K. Kang, Cerritos, CA (US)

(73) Assignee: Enova Systems, Torrance, CA (US)

(*) Notice: Subject to any disclaimer, the term of this patent is extended or adjusted under 35 U.S.C. 154(b) by 0 days.

(21) Appl. No.: 09/895,743

(22) Filed: Jun. 29, 2001

(51) Int. Cl.⁷ .............................................. G01N 27/46
(52) U.S. Cl. ..................................................... 324/426
(58) Field of Search ................................. 324/426–430; 320/132

(56) References Cited

U.S. PATENT DOCUMENTS 4,968,941 A * 11/1990 Rogers ........................ 324/428
4,968,942 A * 11/1990 Palanisamy ................. 324/430

* cited by examiner

Primary Examiner—Edward H. Tso
Assistant Examiner—Pia Tibbits
(74) Attorney, Agent, or Firm—Burns, Doane, Swecker & Mathis LLP

(57) ABSTRACT

A current measurement system for a battery is provided. The current measurement system has a shunt resistor in electrical communication with the battery. The shunt resistor is operative to generate a shunt voltage in response to the current flowing through the battery. The system further includes a voltage to frequency converter in electrical communication with the shunt resistor. The voltage to frequency converter is operative to generate a frequency signal in response to the shunt voltage. A processor of the system determines a frequency value from the frequency signal and determines the current of the battery from predetermined current values. In this respect, the processor can linearly interpolate the current through the battery from the value of the frequency signal and stored predetermined current values such that an accurate current measurement can be made.

20 Claims, 1 Drawing Sheet

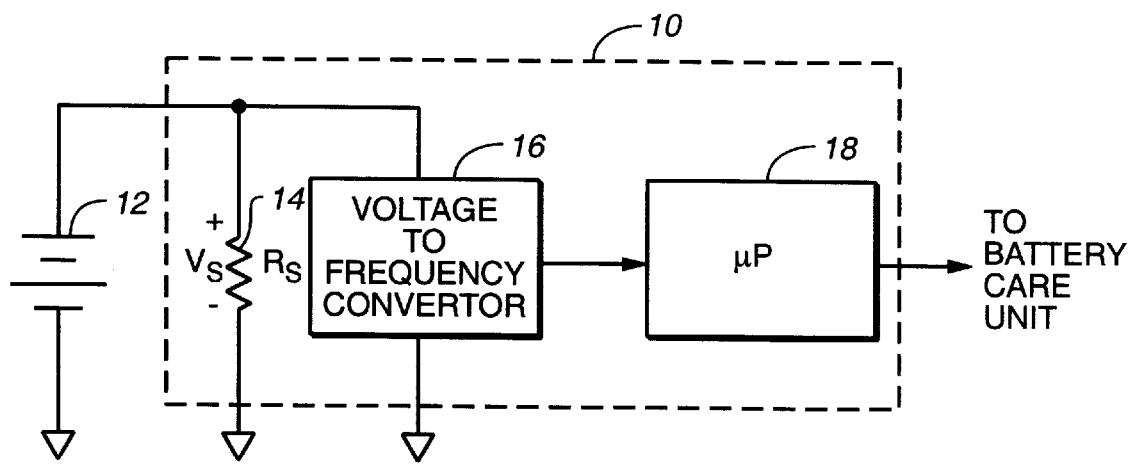
FIG._1

ACCURATE BATTERY CURRENT MEASUREMENT SYSTEM FOR A BATTERY CARE UNIT

FIELD OF THE INVENTION

The present invention relates generally to the measurement of battery current and more particularly to a system which accurately determines the current of the battery from a frequency signal generated in response to the battery current.

STATUS OF THE PRIOR ART

In order to fully charge a battery, the current of the battery must be monitored precisely to determine the rate of charge to be applied to the battery. Specifically, in a pack batteries, the charging rates for each of the batteries may be different due to the physical differences between the batteries. One of the batteries may be fully charged, while another one may be only partially charged eventhough both batteries were given the same amount of charging current and charging time.

In order to fully charge all of the batteries, there is provided an equalization mode at the end of the charging cycle. The equalization mode typically begins when the batteries are about 95% charged. The current to the batteries is reduced during the equalization mode in order to provide a slow charge which tops off the charge of the batteries. The current provided to the batteries during the equalization mode may be from about 0.5 amps to 2.0 amps. It is critical that the current be monitored accurately during the equalization mode in order to equalize the charge of all batteries in the battery pack.

Typically, a Hall sensor has been used to monitor the current provided to the batteries during the equalization mode. The Hall sensor may be error compensated to read the current flowing to the battery at a prescribed value (i.e., around 1 amp). However, often during the equalization mode, the current provided to the batteries may differ from the prescribed value depending upon how much the battery must be charged. As previously mentioned, the current may vary anywhere from about 0.5 to 2.0 amps during the equalization mode which is out of the error compensation range for the Hall sensor. Accordingly, the prior art current measurement systems could not accurately determine the current of the battery over a wide range. As will be recognized, the current through the battery may vary as much as ±350 A for high power applications.

With the need for vehicles to become more environmentally friendly, automakers are creating hybrid, mini-hybrid, fuel cell and pure electric vehicles which utilize a battery as an energy storage device. In the fuel cell and pure electric vehicle, the battery powers electric motors which propel the car. The batteries are charged either through regenerative braking and/or an outside source of electrical power such as the fuel cell. Hybrid and mini-hybrid vehicles do not use an outside source of power to charge the batteries. In hybrid vehicles, a small engine is used to charge the batteries and propel the vehicle. Electric motors are also used to propel the hybrid vehicle. As such, the battery pack is relatively large and provides around 300 volts. Mini-hybrid vehicles use a small battery pack having about 42 volts that is used to power an integrated starter generator of the conventional engine. In both hybrid and mini-hybrid vehicles, the battery is charged via the engine and regenerative braking.

It will be recognized that it is imperative to fully monitor the current during the charging of the batteries of the pure electric, fuel cell hybrid and mini-hybrid vehicles. In order to improve the life expectancy of the batteries, and decrease service and replacement thereof, the current of each of the batteries should be closely monitored in order to avoid overcharging and/or undercharging. Having a fully charged battery pack wherein all of the batteries are charged at an equal capacity will increase the efficiency of the electric vehicle and the life of the battery pack.

The present invention addresses the above-mentioned deficiencies in the prior art current measurement systems by providing a system and method which accurately measures the current of each of the batteries of a battery pack. More specifically, the present invention provides a system which is capable of providing a highly accurate measurement of the battery current during the equalization process. The system of the present invention is operative to provide an accurate current measurement for a wide-range of battery current.

BRIEF SUMMARY OF THE INVENTION

In accordance with the present invention, there is provided a current measurement system for measuring the current flowing through a battery. The system includes a shunt resistor in electrical communication with the battery and operative to generate a shunt voltage in response to the current flowing through the battery. The system further includes a voltage to frequency converter in electrical communication with the shunt resistor. The voltage to frequency converter is operative to generate a frequency signal from the shunt voltage. A processor is in electrical communication with the voltage to frequency converter. The processor is operative to determine the current flowing through the battery in response to the frequency signal generated by the voltage to frequency converter such that an accurate measurement of battery current can be made.

The processor may be programmed with at least one value of the frequency signal and an associated value of the current flowing through the battery. In the preferred embodiment, the processor is programmed with multiple values for the frequency signal and associated multiple values of the current flowing through the battery. In this regard, the processor may be programmed to linearly interpolate the value of the current flowing through the battery from the multiple values of the frequency signal and associated current values. In the preferred embodiment, the processor is programmed with eleven data points corresponding to the current flowing through the battery and eleven values of frequency associated therewith.

In accordance with the present invention, there is provided a method of measuring the current flowing through a battery. The method begins by generating a voltage in response to the current flowing through the battery with a shunt resistor. Next, the voltage is converted into a frequency signal with a voltage to frequency converter. A processor will then determine the current flowing through the battery from the frequency signal and a table associating a value of the frequency signal with a value of the current flowing through the battery. In this regard, the processor will determine the current flowing through the battery by finding the current value associated with the value of the frequency signal from the voltage to frequency converter. The processor can also linearly interpolate the value of the current flowing through the battery from the value of frequency and the associated current flows stored in the table. Accordingly, the processor is operative to make an accurate determination of the battery current.

BRIEF DESCRIPTION OF THE DRAWING

These, as well as other features of the present invention will become more apparent upon reference to the drawing wherein:

FIG. 1 is a circuit diagram of a battery and current measuring system constructed in accordance with the present invention.

DETAILED DESCRIPTION OF THE INVENTION

Referring now to the drawing wherein the showings are for purposes of illustrating a preferred embodiment of the present invention only, and not for purposes of limiting the same, FIG. 1 is a circuit diagram of a current measuring system 10 for measuring the current of a battery 12. The battery 12 may be a member of a battery pack wherein multiple batteries 12 are connected together either serially or in parallel to provide a source of electrical power to a device. As such, the battery 12 will be connected to a discharging device through conventional techniques. Additionally, the battery 12 may be connected to a charger (not shown for clarity) which supplies a source of current in order to charge the battery 12. The battery 12 may be configured for use in a battery pack for an electric or fuel cell vehicle.

The current measuring system 10 has a shunt resistor ($R_s$) 14 which diverts some of the current flowing thru the battery 12. The shunt resistor 14 has a prescribed known value, such that by determining the voltage across the shunt resistor 14, it is possible to calculate the current flowing therethrough and the current flowing through the battery 12. Accordingly, a shunt voltage $V_S$ is generated across the shunt resistor 14.

A voltage to frequency converter 16 is connected across the shunt resistor 14, as seen in FIG. 1. The converter 16 detects the shunt voltage $V_s$ and converts the same into a frequency signal. The converter 16 is operative to generate a frequency signal that corresponds to the voltage of the shunt resistor 14. In this respect, for every voltage of the shunt resistor 14, there is a corresponding frequency signal generated by the voltage to frequency converter 16.

Referring to FIG. 1, the system 10 further includes a microcontroller or microprocessor 18. The output of the voltage to frequency converter 16 is fed into the microprocessor 18 that is operative to detect the frequency of the signal from the converter 16. The microprocessor 18 determines the current flowing through the battery 12 from the frequency signal generated by the converter 16. Specifically, the microprocessor 18 may contain a lookup table in memory which associates the frequency signal of the converter 16 with the current flowing through the battery 12. The lookup table is determined by calibrating and storing the frequency for eleven set current points. The eleven set current points are at: −350 A, −35 A, −3.5 A, −350 mA, −35 mA, 0 A, 35 mA, 350 mA, 3.5 A, 35 A and 350 A. During the calibration and storing procedure, the current of the battery 12 is maintained at the set current point, and the corresponding frequency signal from the voltage to frequency converter 16 is measured. The frequency signal for the set current point is then stored in the lookup table. The measurement error percentage is already incorporated during the calibration procedure thereby resulting in an accurate measurement. In order to determine a current measurement between the set current points, the microprocessor 18 is operative to linearly interpolate the current from the lookup table in order to accurately estimate the current. With this procedure, it is possible to achieve accuracy to within 20 mA. As will be recognized by those of ordinary skill in the art, the lookup table may be stored in memory external to the microprocessor 18.

In the preferred mode of operation, the system 10 constantly measures the current through the battery 12. Specifically, the voltage of the shunt resistor 14 is converted by the converter 16 into the frequency signal. The processor 18 detects the frequency signal and determines the current of the battery 12 by comparing the frequency of the signal with the values stored in memory. The processor 18 will linearly interpolate the value of the current based upon the eleven values stored in memory.

It will be recognized that the microprocessor 18 can convert the frequency signal from the voltage to frequency converter 16 into digital values for ease of computation. In this respect, the microprocessor 18 may contain an analog to digital converter for the conversion process. This will allow the microprocessor 18 to easily compute important values such as Watt-hours and Amp-hours from the digital value of the current. Additionally, the microprocessor 18 may be programmed to perform all computations from the frequency signal generated by the voltage to frequency converter 16. In either instance, it also possible for the system 10 to include an analog-to-digital converter (external to the microprocessor 18) which converts the analog frequency signal to a digital value prior to sending the signal to the microprocessor 18. Alternatively, the voltage to frequency converter 16 may output a digital frequency value that may be fed directly to the microprocessor 18. The microprocessor 18 may be operative to send the current measurement and any other corresponding data derived therefrom to a battery care unit (not shown) in order to control the charging and discharging of the battery 12.

It will be recognized that the current measurement system 10 can be used for the measurement of the battery current during all aspects of the charging and discharging process. Due to the shunt voltage $V_s$ being converted to a frequency signal, the measurement of current is accurate for all ranges. Accordingly, at low current measurements (i.e., around 1 amp) which are generated during the equalization mode, the system 10 can accurately determine the current flowing through the battery 12. In fact, as previously mentioned, the system 10 can measure current with a resolution of about 20 mA at all levels of current.

Additional modifications and improvements of the present invention may also be apparent to those of ordinary skill in the art such as having more than eleven set current points. Thus, the particular combination of parts described and illustrated herein is intended to represent only a certain embodiment of the present invention, and is not intended to serve as limitations of alternative devices within the spirit and scope of the invention.

What is claimed is:

1. A current measurement system for measuring the current flowing through a battery, the current measuring system comprising:

a shunt resistor in electrical communication with the battery, the shunt resistor operative to generate a shunt voltage in response to the current flowing through the battery;

a voltage to frequency converter in electrical communication with the shunt resistor, the voltage to frequency converter being operative to generate a frequency signal from the shunt voltage; and a processor in electrical communication with the voltage to frequency converter, the processor being operative to determine the current flowing through the battery in response to the frequency signal generated by the voltage to frequency converter such that an accurate measurement of current can be made.

2. The system of claim 1 wherein the processor is programmed with at least one value of the frequency signal and an associated value of current flowing through the battery.

3. The system of claim 2 wherein the processor is programmed with multiple values for the frequency and multiple associated values of the current flowing through the battery.

4. The system of claim 3 wherein the processor is programmed to linearly interpolate the value of the current flowing through the battery from the value of the frequency and the value of the associated current.

5. The system of claim 4 wherein the processor is programmed with eleven data points corresponding to the current flowing through the battery and eleven values of frequency associated therewith.

6. The system of claim 1 wherein the processor is programmed to convert the value of the frequency to a digital value to facilitate processing.

7. The system of claim 1 wherein the processor is operative to output a value of the current flowing through the battery in order to control the charging and discharging of the battery.

8. The system of claim 1 wherein the processor is operative to control the charging and discharging of the battery.

9. The system of claim 8 wherein the battery is configured for use in an electric or fuel cell vehicle.

10. A method of measuring the current of a battery, the method comprising the steps of:
   a) generating a voltage in response to the current flowing through the battery;
   b) converting the voltage from the battery into a frequency signal; and
   c) determining the current flowing through the battery from the frequency signal.

11. The method of claim 10 wherein step (a) comprises generating the voltage across a shunt resistor.

12. The method of claim 10 wherein step (b) comprises converting the voltage from the battery into a frequency signal with a voltage to frequency converter.

13. The method of claim 10 wherein step (c) comprises determining the current flowing through the battery by associating the frequency signal with a predetermined current value.

14. The method of claim 13 further comprising the step of calculating a set of current values for corresponding frequency signals prior to step (c).

15. The method of claim 13 wherein step (c) comprises associating the frequency signal with a predetermined current value with a processor.

16. A method of generating a current measurement for a battery, the method comprising the steps of:
   a) generating a prescribed current through the battery;
   b) measuring the voltage of the battery for the prescribed current;
   c) converting the voltage into a frequency signal;
   d) associating the value of the frequency signal with the prescribed current value;
   e) storing the value of the frequency signal and the associated current value; and
   f) further determining the current flowing through the battery by converting a voltage of the battery to a frequency signal and comparing the value of the frequency signal to the stored frequency value in order to interpolate a current value therefrom.

17. The method of claim 16 wherein steps (a)–(e) are repeated in order to store at least two values of the frequency signal and associated current values.

18. The method of claim 17 wherein steps (a) and (f) comprise determining the voltage of the battery by determining a voltage across a shunt resistor of the battery.

19. The method of claim 18 wherein step (f) comprises interpolating the current value with a processor.

20. The method of claim 19 wherein step (c) comprises converting the voltage to a frequency signal with a voltage to frequency converter.

* * * * *